United States Patent [19]
Kaya et al.

[11] Patent Number: 4,828,640
[45] Date of Patent: May 9, 1989

[54] METHOD OF PRODUCING FILMS USING A PEELING JIG

[75] Inventors: Toshio Kaya, Iwakuni; Makoto Fujimoto, Waki; Hiroaki Nakagawa, Iwakuni, all of Japan

[73] Assignee: Mitsui Petrochemical Industries, Ltd., Tokyo, Japan

[21] Appl. No.: 197,964

[22] Filed: May 24, 1988

[30] Foreign Application Priority Data

May 28, 1987 [JP] Japan ................ 52-134357
May 28, 1987 [JP] Japan ................ 52-134358

[51] Int. Cl.$^4$ .................................. B32B 31/18
[52] U.S. Cl. .................................. 156/248; 156/160; 156/229; 156/249; 156/267; 156/292; 156/344; 156/494; 156/584; 428/910
[58] Field of Search ............... 156/160, 229, 247–249, 156/267, 292, 344, 494, 584; 428/910

[56] References Cited

U.S. PATENT DOCUMENTS

| | | | |
|---|---|---|---|
| 4,631,103 | 12/1986 | Ametani | 156/249 X |
| 4,631,110 | 12/1986 | Tsumura et al. | 156/584 |
| 4,732,642 | 3/1988 | Ametani | 156/344 X |
| 4,767,484 | 8/1988 | Schott et al. | 156/247 X |

Primary Examiner—Robert A. Dawson
Attorney, Agent, or Firm—Sherman and Shalloway

[57] ABSTRACT

The invention concerns a method of producing protective films or the like used as protective covers for photomasks or reticles. To peel a thin film off a substrate, a peeling jig constituted by a flexible annular frame with an adhesive applied thereon is pressed against the thin film applied on the substrate; a portion of the peeling jig is grabbed after the peeling jig and the thin film are adhered together; and the peeling jig and the film are peeled off the substrate. Before adhering the peeled film onto a side end surface of a pericle frame, of the two edges of the pericle frame, at least the edge formed by an inside surface thereof and the side end surface thereof is chambered.

6 Claims, 3 Drawing Sheets

METHOD OF PRODUCING FILMS USING A PEELING JIG

BACKGROUND OF THE INVENTION

The present invention relates to a method of producing protective films which are used as protective covers for photomasks, reticles, or the like and a jig for producing the same and, more particularly, to a method of producing films which is used in peeling off a film formed on a substrate in a production process and in adhering the peeled film to one side surface of a frame, and a jig used for peeling off the film formed.

In recent years, protective films typified by pericles have come to be increasingly provided on photomasks and reticles (hereafter simply referred to as masks) for the purposes of protecting mask pattern surfaces and preventing foreign substances such as dust particles from being deposited thereon. To produce a pericle according to a conventional method, a film is first formed on a substrate by spin coating or the like, is then peeled off, and is adhered on one side surface of a pericle frame. Subsequently, a portion of the film projecting from the pericle frame is cut off.

At this juncture, first of all, the peeling the film off the substrate is conventionally carried out as follows: Pieces of a wide adhesive tape which has a small modulus of elasticity are adhered on a periphery of the film in the shape of #, and the film is peeled off carefully from one side by manually holding the adhesive tape. After the film has been released, the pieces of the adhesive tape provided on both sides of the film are manually held, and the film is placed on a pericle frame with an adhesive applied on side end surfaces thereof and is adhered thereto. Since the film is thin, however, when it is peeled off, the film becomes partially elongated and is hence liable to become damaged unless the film is peeled off at a constant speed and uniformly at portions in a direction perpendicular to the peeling direction. Therefore, it has not been easy to peel off the film uniformly at a constant speed without causing breakage.

Secondly, the adhesion of the film onto the pericle frame is conventionally carried out by holding with both hands the pieces of the aforementioned adhesive tape, adhered in the form of # around the periphery of the film to peel the film off the substrate, and by placing the film on the pericle frame with its side coated with the adhesive facing upward. However, if the film is adhered by being simply placed on the pericle frame, slackness is liable of occur on the film surface, and it is impossible to adhere the film uniformly on the entire surface of the side end surface of the frame, so that foams are liable to enter the adhered portion and an uneven surface is likely to occur. For this reason, it is desirable to install the film on the frame with the film set in a tense state by lightly and uniformly applying tension to the film from the four sides. However, it is not easy to apply tension to the film into a planar configuration in such a manner that excessive tension or slackness are not caused n the film surface. In addition, there are cases where the adhesive applied to the frame is extruded to the inner and outer sides of the frame, and the extruded adhesive causes the film to swell at an edge of the film, as shown in FIG. 9. If there is any such swollen portion, there is the possibility of the film becoming broken at the swollen portion when the pericle is held by a device for installing the pericle on the mask. To apply strong tension to eliminate any swelling of the film due to the extruded adhesive is not desirable since the film is liable to become broken.

Thirdly, the protective films are generally cleaned by air blow at the time when they are produced or used (at the time when they are installed on the mask), and, at that time, the film surface vibrates. However, since the thickness of the pericle film is very small, a fracture is likely to occur due to an edge of the pericle frame.

As other methods of producing protective films, the following methods have been proposed: (1) a method in which a releasable film is formed on a substrate by using a material which is capable of undergoing sol-gel conversion, and a thin film is further formed thereon. This laminate is then immersed in warm water, and the releasable film is subjected to sol-gel conversion to cause the thin film to float in the warm water. Subsequently, this thin film is scooped up from the warm water by means of a frame, and is then subjected to heating and drying (Japanese Patent Laid-Open No. 182730/1984), (2) a method in which after a film is formed on a substrate, a pericle frame with an adhesive applied thereto is pressed against the film to allow the film to become adhered thereto, and, after adhesion, the pericle frame is separated from the substrate together with the film, and (3) a method in which, after a film is formed on a substrate, a frame with an adhesive applied thereto is placed on the laminate so as to be adhered. This structure is immersed in water to separate the film from the substrate, and the frame with the frame secured thereto is lifted up from the water and is then allowed to dry (Japanese Patent Laid-Open No. 237450/1985). However, in cases (1) and (3), it is necessary to dry the film after it is recovered from the water, and these methods cannot be applied to an insoluble film and a film whose surface has been provided with surface treatment with an insoluble substance. Moreover, particularly in the case of the former method in which the thin film floating in the water is scooped up by the frame, creases or slackening are liable to occur in the film surface. In addition, in case (2) above, when the frame is pressed against the substrate, there is the risk of causing damage to the substrate, and the film is liable to become broken during cleaning by the air blow, as described above. Furthermore, the film must be peeled off in such a manner as to be lifted up from the portion where the inner side of the frame is adhered to the end surface of the substrate. However, since the space between the film and the substrate assumes the state of a vacuum, a strong force is required in peeling off the film. Hence, there are cases where the film becomes broken, and the frame is subjected to deformation due to a strong force applied locally.

SUMMARY OF THE INVENTION

Accordingly, it is a primary object of the present invention to provide a method of peeling off a film in which an annular flexible provisional frame is adhered to a film formed on a substrate, and which allows the film to be peeled off gradually and uniformly from adhered portions on both sides as a portion thereof is grabbed and peeled off, facilitates peeling by means of a mechanical means such as a robot to permit the film to be peeled off at a fixed speed, and makes it possible to support the film in a planar state and with no waviness created therein, thereby overcoming the above-described drawbacks of the prior art.

Another object of the present invention is to overcome problems that, when the film is pressed against a pericle frame with tension lightly applied to the film, the film at an edge of the frame becomes swollen due to an extruded adhesive, and that the film becomes broken owing to the edge of the frame during cleaning by air blow.

To these ends, according to one aspect of the invention, there is provided a method of peeling off a film, comprising the steps of: pressing a peeling jig constituted by a flexible annular frame with an adhesive applied thereon against a thin film applied on a substrate; grabbing a portion of the peeling jig after the peeling jig and the thin film are adhered together; and peeling off the peeling jig and and the film from the substrate, thereby peeling the thin film from the substrate.

If a portion of the peeling jig is grabbed and pulled away from the substrate, the peeling jig is separated from the substrate while being bent in the form of a cantilever, and the film adhered to the peeling jig is gradually peeled off from a peripheral edge portion of the substrate.

A second aspect of the invention makes it possible to peel off the film from the end surface even if the adhering portions of the jig on the substrate with the film applied thereon are offset to some degree or other.

According to this second aspect of the invention, there is provided a method of peeling off a film, comprising the steps of: adhering an adhesive tape at a peeling starting portion at a perpheral portion of the film applied on a substrate in such a manner as to cause the adhesive tape to project from the substrate; pressing a peeling jig constituted by a flexible annular frame with an adhesive applied thereon against the thin film applied on the substrate, in such a manner that the peeling jig is placed on the adhesive tape; and grabbing a portion of the peeling jig projecting outwardly from the adhesive tape, thereby to peel off the thin film from the substrate.

According to a third aspect of the present invention, there is provided a peeling jig for peeling off a film formed on a substrate, comprising an annular frame having a Young's modulus of 15,000–35,000 kg/cm$^2$ and a bending strength of 50–120 g/10 cm, an adhesive being applied on one surface thereof so as to be adhered to the film formed on the substrate, thereby overcoming the aforementioned drawback.

Finally, according to a fourth aspect of the invention, there is provided a method of producing a pericle, comprising the steps of: chamfering at least an edge of a pericle frame formed by an inside surface thereof and a side end surface thereof to which a pericle film is to be adhered, of two edges consisting of the edge of the pericle frame formed by the inside surface thereof and the side end surface thereof and further consisting of an edge of the pericle frame formed by an outside surface thereof and the side end surface thereof; applying an adhesive to the chamfered side surface of the pericle frame; stretching and placing the pericle film on the pericle frame applied with the adhesive, and cutting off a portion of the pericle film along the outside surface of the pericle frame.

These and other objects, features and advantages of the invention will become apparent from the following description of the invention when read in conjunction with the accompanying drawings.

BRIEF DESCRIPTION OF THE DRAWINGS

FIGS. 4 to 6 are diagrams illustrating a method of testing the bending strength of the peeling jig, in which
FIG. 4 is a top plan view of a test piece;
FIG. 5 is a cross-sectional view prior to pulling;
FIG. 6 is a cross-sectional view illustrating a state after pulling.

DESCRIPTION OF THE PREFERRED EMBODIMENTS

Figure 1:
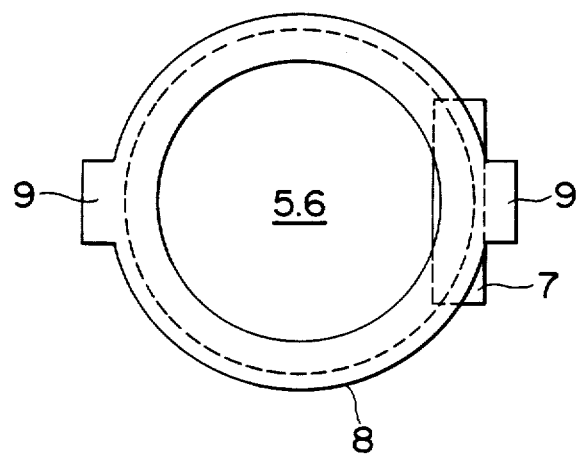
FIG. 1 is a top plan view of a peeling jig of the invention adhered to a substrate with a film formed thereon.

Referring to FIGS. 1 to 8, a description will be given of an embodiment of the present invention in accordance with first to fourth aspects of the invention.

According to one aspect of the invention, there is provided a method of peelng off a film, comprising the steps of: pressing a peeling jig constituted by a flexible annular frame with an adhesive applied thereon against a thin film applied on a substrate; grabbing a portion of the peeling jig after the peeling jig and the thin film are adhered together; and peeling off the peeling jig and and the film from the substrate, thereby peeling the thin film from the substrate.

If a portion of the peeling jig is grabbed and pulled away from the substrate, the peeling jig is separated from the substrate while being bent in the form of a cantilever, and the film adhered to the peeling jig is gradually peeled off from a peripheral edge portion of the substrate.

When grabbing the jig, an arrangement may be provided such that an arbitrary portion of the peripheral edge of the jig protecting laterally from the substrate is grabbed. Preferably, however, a grabbing portion such as a lug, a handle, a knob, or the like is formed integrally with the jig, and that grabbing portion is grabbed.

The method of the present invention is typically applicable to protective films provided on masks, but can be similarly applied to films in other fields as well.

When the film applied on the substrate is peeled off, it is important to peel it from an end surface of the substrate. If an attempt is made to peel it off from the inner side of the end surface of the substrate, the space between the substrate and the film assumes a vacuum, so that a relatively strong force is required, and when the air enters that space to cancel the vacuum, exfoliation occurs suddenly. Hence, damage to the film is likely to occur, resulting in breakage.

When peeling is carried out by using the aforementioned peeling jig, the adhesive is applied to that jig and the jig is pressed against the thin film on the substrate to effect adhesion, as described above. However, depending on a location or the viscosity of the adhesive, there are cases where the adhesive fails to be spread to the end surface of the substrate. Accordingly, in this case, the peeling is effected from the inner side of the end surface of the substrate, and the aforementioned problem is liable to occur. It is possible to apply the adhesive in areas close to the peripheral edge of the peeling jig or to allow the adhesive to be spread sufficiently on the end surface when the jig is pressed against the film after applying an adhesive of good fluidity. In this case, the adhesive is often pressed out from the end surface, and a strong force is required in peeling off the film adhered to the end surface of the substrate. For that reason, sudden exfoliation occurs, possibly damaging the film. Hence, when adhering the jig, it is necessary to effect a positioning in such a manner that the adhesive reaches to the edges of the end surface but does not project therefrom. However, such positioning involves a very subtle operation and is difficult to effect.

A second aspect of the invention overcomes the aforementioned problem, and makes it possible to peel off the film from the end surface even if the adhering portions of the jig on the substrate with the film applied thereon are offset to some degree or other.

According to this second aspect of the invention, there is provided a method of peeling off a film, comprising the steps of: adhering an adhesive tape at a peeling starting portion at a peripheral portion of the film applied on a substrate in such a manner as to cause the adhesive tape to project from the substrate; pressing a peeling jig constituted by a flexible annular frame with an adhesive applied thereon against the thin film applied on the substrate, in such a manner that the peeling jig is placed on the adhesive tape; and grabbing a portion of the peeling jig projecting outwardly from the adhesive tape; thereby to peel off the thin film from the substrate.

In the above-described aspects of the invention, the reason why a flexible peeling jig is used is that, if the jig is formed of a rigid material, the peeling is carried out at once over the entire surface of the film, so that a strong force is required, and the film is hence liable to become broken. Nevertheless, it is undesirable if the jig is highly resilient and very flexible, or has small resiliency and is difficult to bend. If the film is highly resilient and is very flexible, when a portion of the jig is grabbed by a robot to carry the film, the free end of the jig droops and it becomes difficult to place the jig correctly on the film disposed on the substrate. As a result, the adhering portions are liable to become offset, or it becomes impossible to effect adhesion of the entire portions. Also, when the film peeled off the substrate by adhering the jig thereto is adhered to a frame in a following process, the film is liable to undergo deflection or slackness owing to the deflection of the jig, making it impossible to stretch the film on the frame. Thus, deteriorated handling efficiency results. Meanwhile, if the resiliency is small and the jig is difficult to bend, the peeling of the film cannot be effected continuously and tends to be carried out intermittently. In consequence, numerous creases tend to be formed in a direction perpendicular to the peeling direction.

According to a third apsect of the present invention, there is provided a peeling jig for peeling off a film formed on a substrate, comprising an annular frame having a Young's modulus of 15,000–35,000 kg/cm$^2$ and a bending strength of 50–120 g/10 cm, an adhesive being applied on one surface thereof so as to be adhered to the film formed on the substrate, thereby overcoming the aforementioned drawback.

Figure 4:
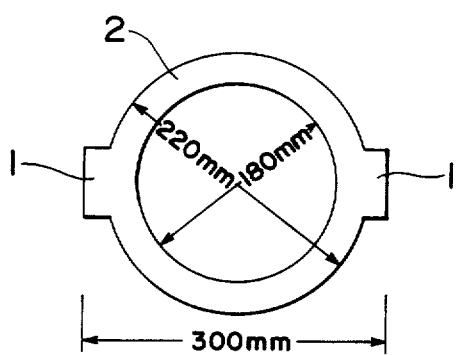
Figure 5:
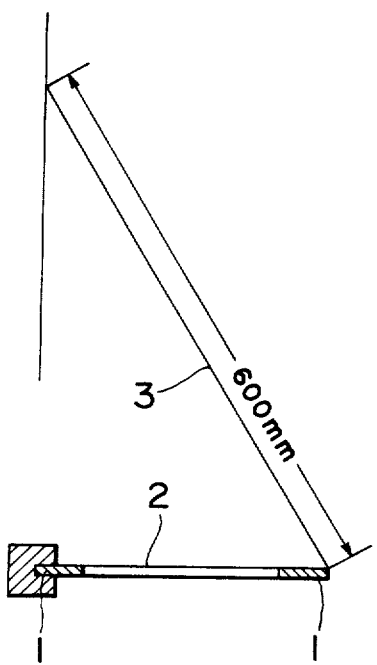
Figure 6:
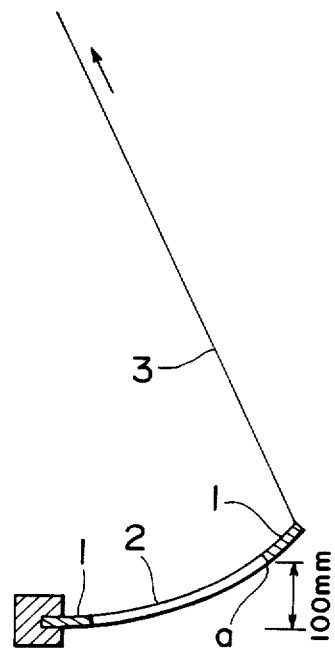

A bending strength referred to here means tension measured as follows: As shown in FIG. 4, using an annular frame 2 having an inside diameter of 180 mm, an outside diameter of 220 mm, a length of the jig including lugs 1 formed projectingly at opposite sides thereof being 300 mm, and a thickness of 1.5 mm, one of the lugs 1 is fixed, as shown in FIG. 5, and one end of a cord 3 with a length of 600 mm is connected to the other lug 1, while the other end of the cord is pulled vertically at a fixed point, and the deflection at point a becomes 100 mm.

Finally, according to a fourth aspect of the invention, there is provided a method of producing a pericle, comprising the steps of: chamfering at least an edge of a pericle frame formed by an inside suface thereof and a side end surface thereof to which a pericle film is to be adhered, of two edges consisting of the edge of the pericle frame formed by the inside surface thereof and the end surface thereof and further consisting of an edge of the pericle frame formed by an outside surface thereof and the end surface thereof; applying an adhesive to the chamfered side surface of the pericle frame; stretching and placing the pericle film on the pericle frame applied with the adhesive; and cutting off a portion of the pericle film along the outside surface of the pericle frame.

The stretching of the pericle film can be effected manually by grabbing the adhesive tape to peel off the film, in a manner similar to a conventional method. However, it is difficult to press the film against the pericle frame and stretch the same by applying tension uniformly in such a manner that no excessive tension is applied to the film surface or no creases are formed therein. This problem can be overcome by provisionally taking up the film formed on the substrate, by means of a provisional frame, and by stretching the film on the pericle frame using that provisional frame. Namely, an adhesive is applied to an annular provisional frame and the provisional frame is adhered to the film disposed on the substrate. After the film is peeled off by being grabbed by the provisional frame, the provisional frame is pressed against the pericle frame or vice versa, or the two members are pressed against each other, thereby overcoming the aforementioned problem. Since the film on the substrate is transferred onto the provisional frame, even if the provisional frame is manually held, it is possible to maintain the film surface in a planar state. Thus, it is possible to stretch the film on the pericle frame with tension applied to the film by simply pressing the provisional frame against the pericle frame or vice versa, or by simply pressing the two members against each other (see FIG. 7).

The chamfering is carried out by providing a slanting surface or roundness to the edge, and when a slanting surface is provided, the slanting surface is formed with 0.1–0.7 C, preferably 0.2–0.4 C.

Figure 9:
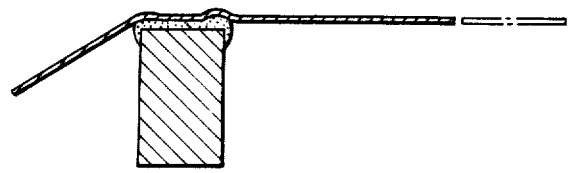
FIG. 9 is a cross-sectional view of essential portions of a conventional example.

If the chamfering is greater than 0.1, a swelling portion is created, a shown in FIG. 9, and when the pericle is provided on the mask, there is the risk of the film becoming broken. Also, if the chambering is greater than 0.7, the adhesive surface becomes small, so that the adhesiveness weakens, and the film can exfoliate during air blow.

Figure 7:
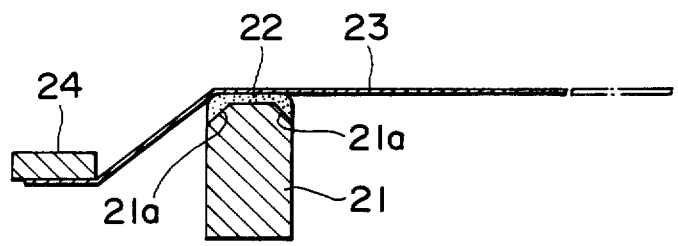
FIG. 7 is a cross-sectional view of essential portions illustrating a state after a pericle film has been adhered.
Figure 8:
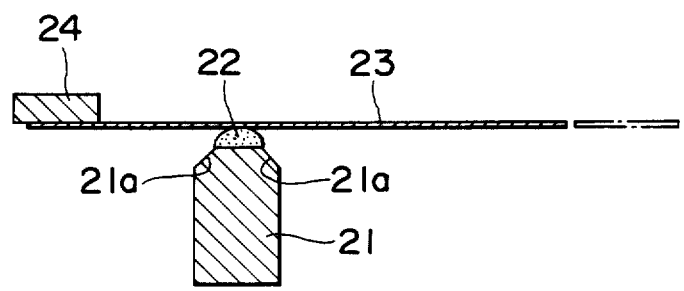
FIG. 8 is a cross-sectional view of essential portions illustrating a state after the pericle film has been adhered.

In addition, as shown in FIG. 8, after the adhesive 22 is applied to the side end surface of the pericle frame 21 excluding the chamfered portions 21a, the pericle film 23 is placed on the side end surface, and tension is applied to the provisional frame or the pericle frame, or both, the adhesive 22 is pressed out to the inner and outer sides of the frame, and is extruded to the chamfered portions 21a (see FIG. 7). At this juncture, tension is applied in such a manner that the thickness of the pericle film becomes smaller by 1–10%, preferably 3–7%.

If the film is adhered in such a manner that the thickness of the pericle film becomes smaller by 1% or less, creases are liable to be formed in the film. In addition, if the film is adhered by applying tension thereto in such a manner that the thickness of the pericle film becomes smaller by more than 10%, the thickness of the film in the vicinity of the side end surface of the frame becomes small, so that the film is liable to become broken during air blow.

A description will now be given of an example of the embodiment in accordance with the first to third aspects of the present invention.

Figure 2:
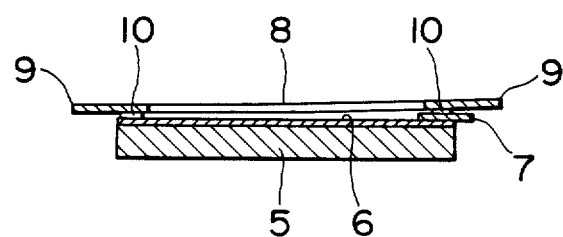
FIG. 2 is a cross-sectional view thereof.
Figure 3:
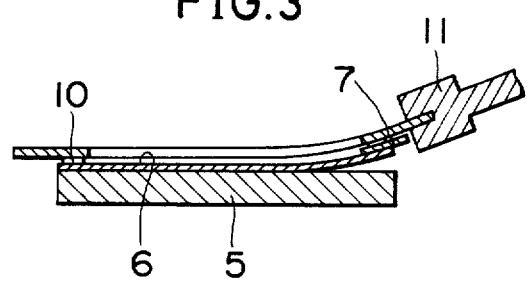
FIG. 3 is a cross-sectional view thereof during peeling.

As shown in FIGS. 1 and 2, an adhesive tape 7 with a width of 20 mm and a length of 10–100 mm is first adhered at a peeling portion of a nitrocellulose film 6 formed on a glass substrate 5 by means of spin coating or the like, in such a manner as to protrude from a peripheral edge of the film 6. Subsequently, one of a pair of lugs 9, which are respectively provided on opposing sides of a peeling jig 8 constituted by a frame 2, as shown in FIG. 4, and on which an adhesive 10 is applied on an entire circumferential surface thereof, is grabbed by a robot (a part of which is designated at reference numeral 11) from above, and is carried to above the substrate 5. With the side of the peeling jig 8 to which the adhesive 10 is to be applied facing downward, the peeling jig 8 is placed on the nitrocellulose film 6 and adhered thereto in such a manner that one of the lugs 9 projects from the adhesive tape 7. The lug 9 projecting from the adhesive tape 7 is then grabbed by the robot, and is peeled off at a fixed speed (FIG. 3).

When a peeling test in accordance with this embodiment was conducted 150 times, the number of cases in which it was able to peel off the nitrocellulose film without being broken off was 145, and the success rate was 96.7%. When a peeling test was conducted without using the adhesive tape 7, in the same manner as the above-described embodiment, the number of successful cases was 25 with respect to 100 times of peeling, and the success rate was only 25%.

In this embodiment, as for the peeling jig 8, a material having a Young's modulus of 15,00–35,000 kg/cm$^2$ and a bending strength of 50–120 g/10 cm is used. Accordingly, no nitrocellulose film in which creases are formed in a direction perpendicular to the peeling direction was obtained. In addition, the nitrocellulose film 6 which is supported by the jig 8 at the peripheral portion thereof maintains a substantially planar configuration even if one end of the jig 8 is supported in the form of a cantilever. For this reason, handling can be facilitated at the time when the film is stretched on a frame in a following process.

Next, comparative examples in which peeling jigs of materials other than that described above will be described below.

COMPARATIVE EXAMPLE 1

When 2.65μ-thick nitrocellulose films each formed on the glass substrate were peeled off at a rate of 10 mm/sec by using a metallic jig having a Young's modulus of 40,000 kg/cm$^2$ and a bending strength of 150 g/10 cm, it was not possible to peel off each of the films continuously, and the state was such that the film was peeled off intermittently. As a result, films in which numerous creases were formed perpendicularly to the peeling direction were obtained.

COMPARATIVE EXAMPLE 2

When a synthetic resin-made jig having a Young's modulus of 50,000 kg/cm$^2$ and a bending strength of 20 g/10 cm, was used, at the time when one lug of the jig was grabbed and carried by the robot, the following deteriorated handling features were encountered: The free end of the nitrocellulose film drooped, which caused the adhering position to be offset, and made it impossible to cause the overall jig to be adhered accurately to the film on the substrate. In addition, it was not able to stretch the film in a frame in a following process.

Referring now to FIGS. 7 and 8, a description will be given of another embodiment in accordance with the fourth aspect of the present invention.

First, an edge formed by an inside surface of a pericle frame 21 and a side end surface to which a pericle film 23 is to be adhered as well as an edge formed by an outside surface of the pericle frame 21 and the side end surface are chamfered, and an adhesive 22 is applied to the side end surface of the pericle frame 21 excluding chamfered portions 21a in such a way as to be piled up thereon. (FIG. 8). Before or after this application, a pericle film 23 formed on the substrate is transferred onto a provisional frame 24, as described before. Subsequently, by grabbing the provisional frame 24, the pericle film 23 is placed on the side of the pericle frame 21 to which the adhesive 22 is to be applied. In this state, the provisional frame 24 is depressed, or the pericle frame 21 is lifted up, or the two members are pressed against each other, thereby adhering the pericle film 23 onto the pericle frame 21 (FIG. 7). Subsequently, a portion of the film 23 extruding from the pericle frame 21 is cut off at the edge of the pericle frame 21.

As described above, in accordance with the first aspect of the invention, the peeling jig is annular and flexible, so that if one portion of the peeling jig is grabbed and peeled, the peeling jig bends in the form of a cantilever, and the film can be peeled off, and the peeling can be effected gradually. Hence, even a thin film which is liable to be torn if peeled off strongly at one time can be peeled off without being torn. In addition, by grapping a portion of the jig and simply pulling off the jig, the peeling can be performed uniformly at adhered portions that are perpendicular to the peeling direction, and the film can therefore be peeled off relatively uniformly at each portion even if the peeling jig is not pulled off at a plurality of locations. Accordingly, local slackening or excessive tension are unlikely to occur in the film surface. The film which is peeled off from the substrate, is adhered to the jig, and is supported thereby, can be maintained in a planar state, and creases or slackening do not occur insofar as the jig is not twisted or deflected, so that handling can be facilitated. Furthermore, since it is possible to effect peeling by using a mechanical means such a robot by virtue of the above-described aspects, the invention contributes to labor saving and improves the operating efficiency. Moreover, since the peeling can be performed readily at a fixed speed, breakage is unlikely to occur in the film.

In accordance with the second aspect of the invention, it is unnecessary to effect adhesion by accurately positioning the peeling jig in such a manner that the peeling jig will be aligned with the end surface of the substrate. If the peeling jig is suitably positioned on the substrate in such a manner that the peeling jig is merely placed on the adhesive tape adhered at the peeling starting position, the peeling off of the film from the end surface becomes possible even if the position of the peeling position is offset to some degree or other. Consequently, the number of cases where the film becomes damage during peeling off is substantially reduced, so that the production yield improves.

In accordance with the third aspect of the invention, since the peeling jig is suitably flexible, it is possible to effect the peeling off of the film continuously and progressively, and, since the peeling jig does not bend excessively, handling can be facilitated.

In accordance with the fourth aspect of the invention, although the adhesive applied to the side end surface of the pericle frame is extruded to the inside and outside of the frame, the extruded adhesive is pressed out to the chamfered portions and are received thereby, so that the film does not swell at the edge of the frame. Hence, at the time of handling of the film to be applied on the mask, the problem that the film becomes broken or a similar problem can be overcome. In addition, during cleaning by air blow, even if the pericle film vibrates, the breakage of the film at the edge of the frame can be prevented, or the number of cases of such breakage can be reduced.

What is claimed is:

1. A method of peeling off a film, comprising the steps of:

pressing a peeling jig constituted by a flexible annular frame with an adhesive applied thereon against a thin film applied on a substrate;

grabbing a portion of said peeling jig after said peeling jig and said thin film are adhered together; and peeling off said peeling jig and and said film from said substrate, thereby peeling said thin film from said substrate.

2. A method of peeling off a film according to claim 1, wherein said peeling jig is provided with a grabbing portion such as a lug, handle, a knob, or the like projecting laterally from said substrate or projecting upward.

3. A method of peeling off a film, comprising the steps of:

adhering an adhesive tape at a peeling starting portion at a peripheral portion of said film applied on a substrate in such a manner as to cause said adhesive tape to project from said substrate;

pressing a peeling jig constituted by a flexible annular frame with an adhesive applied thereon against said thin film applied on said substrate, in such a manner that said peeling jig is placed on said adhesive tape; and grabbing a portion of said peeling jig projecting outwardly from said adhesive tape, thereby to peel off said thin film from said substrate.

4. A method of producing a pericle, comprising the steps of:

chamfering at least an edge of a pericle frame formed by an inside surface thereof and a side end surface thereof to which a pericle film is to be adhered, of two edges consisting of said edge of said pericle frame formed by said inside surface thereof and said end surface thereof and further consisting of an edge of said pericle frame formed by an outside surface thereof and said end surface thereof;

applying an adhesive to said chamfered side surface of said pericle frame;

stretching and placing said pericle film on said pericle frame applied with said adhesive; and cutting off a portion of said pericile film along said outside surface of said pericle frame.

5. A method of producing a pericle according to claim 4, wherein said pericle film is peeled off and held by a provisional frame by adhering said provisional frame to said film formed on said substrate, before said film is adhered to said pericle frame.

6. A method of producing a pericle according to claim 4, wherein said chamfering is effected by providing a slanting surface at an angle of 0.1–0.7C.

UNITED STATES PATENT AND TRADEMARK OFFICE
CERTIFICATE OF CORRECTION

PATENT NO.  : 4,828,640
DATED       : May 9, 1989
INVENTOR(S) : TOSHIO KAYA, ET AL.

It is certified that error appears in the above-identified patent and that said Letters Patent is hereby corrected as shown below:

On the face of the patent, under "Foreign Application Priority Data", the application numbers should be changed to read as follows:

Japan "52-134357" should read --62-134357--; and

Japan "52-134358" should read --62-134358--.

Signed and Sealed this

Tenth Day of October, 1989

Attest:

DONALD J. QUIGG

Attesting Officer

Commissioner of Patents and Trademarks

UNITED STATES PATENT AND TRADEMARK OFFICE
CERTIFICATE OF CORRECTION

PATENT NO. : 4,828,640
DATED : May 9, 1989
INVENTOR(S) : KAYA ET AL.

It is certified that error appears in the above-identified patent and that said Letters Patent is hereby corrected as shown below:

In the Abstract, line 10, delete "pericle" and insert --pellicle--.

line 11, delete "pericle" and insert --pellicle--.

Column 1, line 14, delete "pericles" and insert --pellicles--;

line 19, delete "pericle" and insert --pellicle--;

lines 22-23, delete "pericle" and insert --pellicle--;

line 24, delete "pericle" and insert --pellicle--;

line 33, delete "pericle" and insert --pellicle--;

line 42, delete "pericle" and insert --pellicle--;

line 47, delete "pericle" and insert --pellicle--;

line 49, delete "pericle" and insert --pellicle--;

line 66, delete "pericle" and insert --pellicle--.

line 67, delete "pericle" and insert --pellicle--.

UNITED STATES PATENT AND TRADEMARK OFFICE
CERTIFICATE OF CORRECTION

PATENT NO. : 4,828,640
DATED : May 9, 1989
INVENTOR(S) : KAYA ET AL.

It is certified that error appears in the above-identified patent and that said Letters Patent is hereby corrected as shown below:

Column 2, line 7, delete "pericle" and insert
--pellicle--;
    line 8, delete "pericle" and insert
--pellicle--;
    line 21, delete "pericle" and insert
--pellicle--;
    line 23, delete "pericle" and insert
--pellicle--.
Column 3, line 3, delete "pericle" and insert
--pellicle--;
    line 51, delete "pericle" and insert
--pellicle--;
    line 53, delete "pericle" and insert
--pellicle--;
    line 54, delete "pericle" and insert
--pellicle--;
    line 56, delete "pericle" and insert
--pellicle--;
    line 58, delete "pericle" and insert
--pellicle--

UNITED STATES PATENT AND TRADEMARK OFFICE
CERTIFICATE OF CORRECTION

PATENT NO. : 4,828,640
DATED : May 9, 1989
INVENTOR(S) : KAYA ET AL.

It is certified that error appears in the above-identified patent and that said Letters Patent is hereby corrected as shown below:

Column 3, line 60, delete "pericle" and insert --pellicle--;
line 62, delete "pericle" and insert --pellicle--;
line 63, delete "pericle" and insert --pellicle--;
line 64, delete "pericle" and insert --pellicle--.

Column 4, line 14, delete "pericle" and insert --pellicle--;
line 16, delete "pericle" and insert --pellicle--.

Column 6, line 9, delete "pericle" and insert --pellicle--;
line 11, delete "pericle" and insert --pellicle--;
line 12, delete "pericle" and insert --pellicle--;
line 14, delete "pericle" and insert --pellicle--;

UNITED STATES PATENT AND TRADEMARK OFFICE
CERTIFICATE OF CORRECTION

PATENT NO. : 4,828,640
DATED : May 9, 1989
INVENTOR(S) : KAYA ET AL.

It is certified that error appears in the above-identified patent and that said Letters Patent is hereby corrected as shown below:

Column 6, line 16, delete "pericle" and insert --pellicle--;
    line 18, delete "pericle" and insert --pellicle--;
    line 19, delete "pericle" (both occurrences) and insert --pellicle-- (both occurrences);
    line 21, delete "pericle" and insert --pellicle--;
    line 22, delete "pericle" and insert --pellicle--;
    line 23, delete "pericle" and insert --pellicle--;
    line 27, delete "pericle" and insert --pellicle--;
    line 33, delete "pericle" and insert --pellicle--;
    line 38, delete "pericle" and insert --pellicle--;
    line 44, delete "pericle" and insert --pellicle--;
    line 46, delete "pericle" and insert --pellicle--;

UNITED STATES PATENT AND TRADEMARK OFFICE
CERTIFICATE OF CORRECTION

PATENT NO. : 4,828,640
DATED : May 9, 1989
INVENTOR(S) : KAYA ET AL.

Page 5 of 8

It is certified that error appears in the above-identified patent and that said Letters Patent is hereby corrected as shown below:

Column 6, line 54, delete "pericle" and insert
--pellicle--;
    line 61, delete "pericle" and insert
--pellicle--;
    line 62, delete "pericle" and insert
--pellicle--;
    line 64, delete "pericle" and insert
--pellicle--.
Column 7, line 1, delete "pericle" and insert
--pellicle--;
    line 4, delete "pericle" and insert
--pellicle--;
    line 7, delete "pericle" and insert
--pellicle--.
Column 8, line 15, delete "pericle" and insert
--pellicle--;
    line 16, delete "pericle" and insert
--pellicle--;
    line 18, delete "pericle" and insert
--pellicle--;

UNITED STATES PATENT AND TRADEMARK OFFICE
CERTIFICATE OF CORRECTION

PATENT NO. : 4,828,640

DATED : May 9, 1989

INVENTOR(S) : KAYA ET AL.

It is certified that error appears in the above-identified patent and that said Letters Patent is hereby corrected as shown below:

Column 8, line 20, delete "pericle" and insert --pellicle--;

line 23, delete "pericle" and insert --pellicle--;

lines 25-26, delete "pericle" (both occurrences) and insert --pellicle-- (both occurrences);

line 28, delete "pericle" and insert --pellicle--;

line 30, delete "pericle" and insert --pellicle--;

line 31, delete "pericle" and insert --pellicle--;

line 32, delete "pericle" and insert --pellicle--;

line 33, delete "pericle" and insert --pellicle--.

Column 9, line 13, delete "pericle" and insert --pellicle--;

line 20, delete "pericle" and insert --pellicle--;

UNITED STATES PATENT AND TRADEMARK OFFICE
CERTIFICATE OF CORRECTION

PATENT NO. : 4,828,640

DATED : May 9, 1989

INVENTOR(S) : KAYA ET AL.

Page 7 of 8

It is certified that error appears in the above-identified patent and that said Letters Patent is hereby corrected as shown below:

Column 9, line 33, delete "and" (second occurrence).

Column 10, claim 4, line 1 of the claim, delete "pericle" and insert --pellicle--;

line 3 of the claim delete "pericle" and insert --pellicle--;

line 5 of the claim delete "pericle" and insert --pellicle--;

line 6 of the claim delete "pericle" and insert --pellicle--;

line 9 of the claim delete "pericle" and insert --pellicle--;

line 12 of the claim delete "pericle" and insert --pellicle--;

line 13 of the claim delete "pericle" (both occurrences) and insert --pellicle-- (both occurrences);

line 15 of the claim delete "pericile" and insert --pellicle--;

line 16 of the claim delete "pericle" and insert --pellicle--.

UNITED STATES PATENT AND TRADEMARK OFFICE
CERTIFICATE OF CORRECTION

PATENT NO. : 4,828,640
DATED : May 9, 1989
INVENTOR(S) : KAYA ET AL.

It is certified that error appears in the above-identified patent and that said Letters Patent is hereby corrected as shown below:

Column 10, claim 5, line 2 of the claim delete "pericle"
    and insert --pellicle--;
                    line 5 of the claim delete "pericle"
    and insert --pellicle--.

Signed and Sealed this

Seventh Day of May, 1991

Attest:

HARRY F. MANBECK, JR.

*Attesting Officer*     *Commissioner of Patents and Trademarks*